United States Patent [19]

Corrigan

[11] Patent Number: 5,128,947
[45] Date of Patent: Jul. 7, 1992

[54] SELF-CHECKING MEMORY CELL ARRAY APPARATUS

[75] Inventor: Gerald Corrigan, Chicago, Ill.

[73] Assignee: Motorola, Inc., Schaumburg, Ill.

[21] Appl. No.: 373,963

[22] Filed: Jun. 30, 1989

[51] Int. Cl.$^5$ .............................................. G06F 11/00
[52] U.S. Cl. ................................................... 371/63
[58] Field of Search .................. 371/68.1, 21.1, 37.7, 371/63, 52

[56] References Cited

U.S. PATENT DOCUMENTS

| | | | |
|---|---|---|---|
| 3,289,160 | 11/1966 | Carter et al. | 371/52 |
| 3,638,184 | 1/1972 | Beuscher et al. | 371/52 |
| 4,362,112 | 7/1987 | Stodola | 371/63 |
| 4,541,076 | 9/1985 | Bowers et al. | 371/63 |
| 4,700,346 | 10/1987 | Chandran et al. | 371/63 |
| 4,748,627 | 5/1988 | Ohsawa | 371/13 |
| 4,757,503 | 7/1988 | Hays et al. | 371/68.1 |
| 4,768,193 | 8/1988 | Takemae | 371/10.3 |
| 4,785,453 | 11/1988 | Chandran et al. | 371/63 |
| 4,837,747 | 6/1989 | Dosaka et al. | 371/10.3 |
| 4,888,772 | 12/1989 | Tanigawa | 371/21.2 |

OTHER PUBLICATIONS

Neil Weste and Kamram Eshraghian, Principles of CMOS VSLI Design: A Systems Prospectus, Addison-Wesley Publishing Company Oct., 1985pp. 348-365 ©1985 by AT&T Bell Laboratories & Kamram Eshraghian.
Yoshihiro Tohma, "Coding Techniques in Fault Tolerant, Self-Checking and Fail-Safe Circuits": Chapter 4 of *Fault Tolerant Computing: Theory and Techniques*, vol. 1, pp. 290-291, D. K. Pradhan, edition, ©1986 by Prentice-Hall.

Primary Examiner—Jerry Smith
Assistant Examiner—Phung M. Chung
Attorney, Agent, or Firm—Phillip H. Melamed

[57] ABSTRACT

A totally self-checking memory cell array apparatus (30) has an array (31) of memory cells (32) selectively addressed by row and column decoders (33, 35) which receive unidirectional error detecting code signals as address inputs (34, 36). Data, as a multiple bit data word (A, B, $C_1$, $C_2$), is stored in the array (31) in unidirectional error detecting code form. Cells in each row (1-8) of the array have two separate row select connection lines (45 and 45a) for coupling the cell to data and data complement (46, 46*) connections. Error detection circuits (44, 47) are provided which determine errors by comparing the data and data complement lines for each data bit read out of the array and for detecting when multiple bit data words read out of the array are not coded in a unidirectional error detecting code format. The above apparatus provides error indications in case of any unidirectional errors in the row or column input address signals or the row or column decoders, or any unidirectional error corruption of the data stored in the memory cell array. This is achieved without completely duplicating each memory cell in the array and all row and column decoder circuitry.

15 Claims, 4 Drawing Sheets

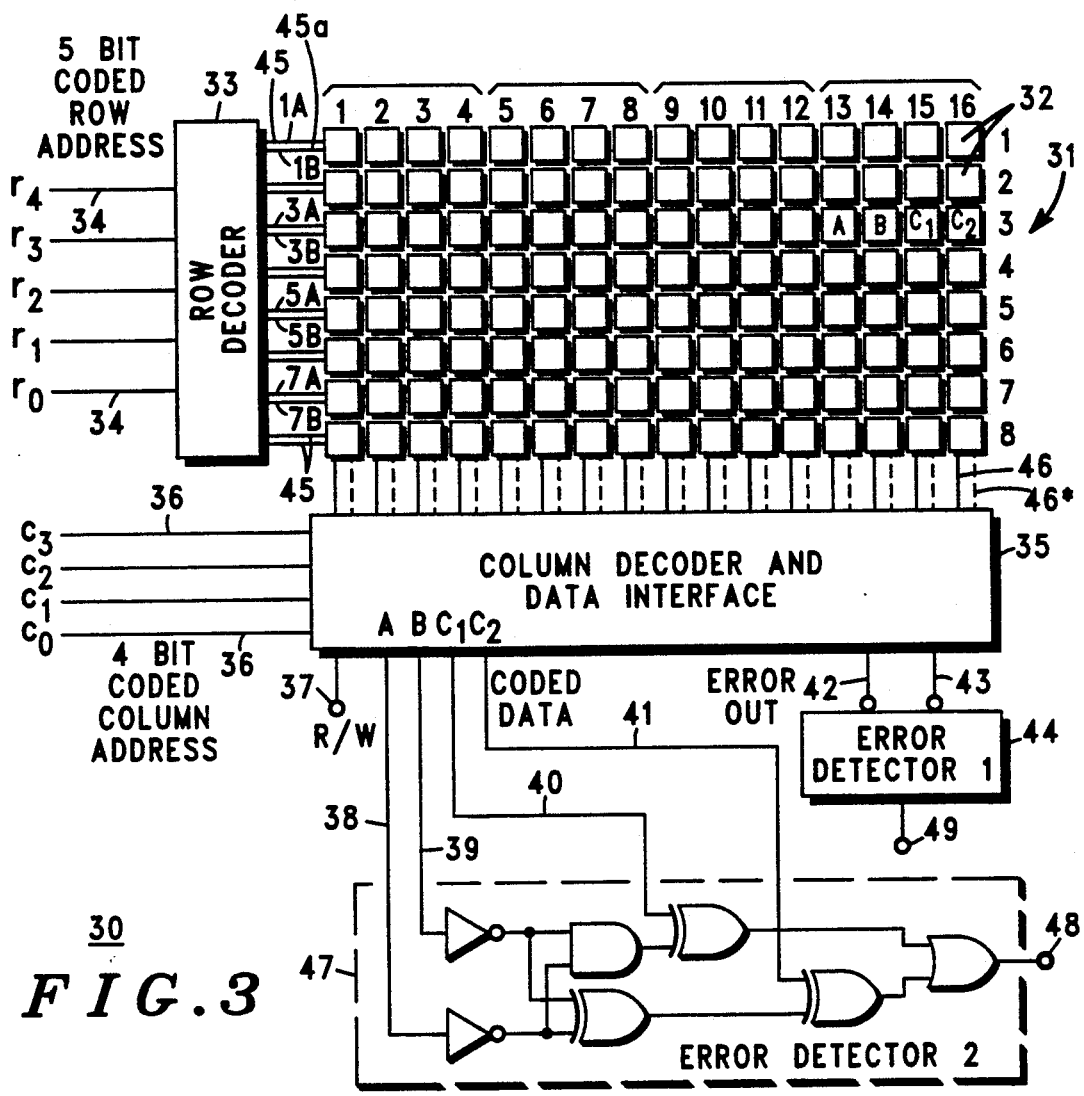
FIG. 3
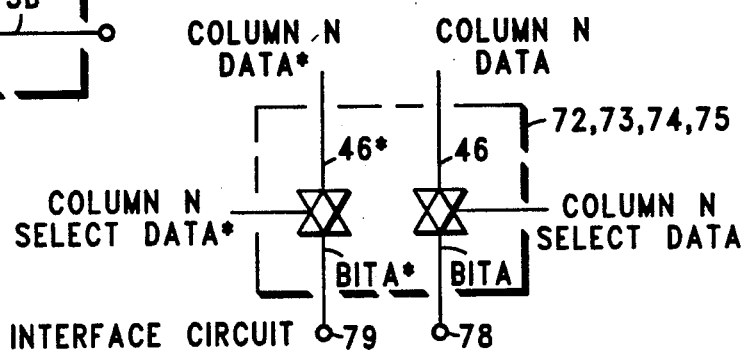
FIG. 7
FIG. 9

2 DATA BIT, 4 BIT UNIDIRECTIONAL ERROR DETECTING CODE

| A | B | $c_1$ | $c_2$ | $c_3$ | $c_2$ | $c_1$ | $c_0$ |
|---|---|---|---|---|---|---|---|
| | | | | 0 | 0 | 0 | 0 |
| | | | | 0 | 0 | 0 | 1 |
| | | | | 0 | 0 | 1 | 0 ← |
| | | | | 0 | 0 | 1 | 1 |
| | | | | 0 | 1 | 0 | 0 |
| | | | | 0 | 1 | 0 | 1 ← |
| | | | | 0 | 1 | 1 | 0 |
| | | | | 0 | 1 | 1 | 1 |
| | | | | 1 | 0 | 0 | 0 |
| | | | | 1 | 0 | 0 | 1 ← |
| | | | | 1 | 0 | 1 | 0 |
| | | | | 1 | 0 | 1 | 1 |
| | | | | 1 | 1 | 0 | 0 ← |
| | | | | 1 | 1 | 0 | 1 |
| | | | | 1 | 1 | 1 | 0 |
| | | | | 1 | 1 | 1 | 1 |

ADDRESS/DATA BITS | CODE/CHECK BITS

3 DATA BIT, 5 BIT UNIDIRECTIONAL ERROR DETECTING CODE

| ROW SELECTED | $r_4$ | $r_3$ | $r_2$ | $r_1$ | $r_0$ |
|---|---|---|---|---|---|
| | 0 | 0 | 0 | 0 | 0 |
| | 0 | 0 | 0 | 0 | 1 |
| | 0 | 0 | 0 | 1 | 0 |
| 1 | 0 | 0 | 0 | 1 | 1 ← |
| | 0 | 0 | 1 | 0 | 0 |
| | 0 | 0 | 1 | 0 | 1 |
| 2 | 0 | 0 | 1 | 1 | 0 ← |
| | 0 | 0 | 1 | 1 | 1 |
| | 0 | 1 | 0 | 0 | 0 |
| | 0 | 1 | 0 | 0 | 1 |
| 3 | 0 | 1 | 0 | 1 | 0 ← |
| | 0 | 1 | 0 | 1 | 1 |
| | 0 | 1 | 1 | 0 | 0 |
| 4 | 0 | 1 | 1 | 0 | 1 ← |
| | 0 | 1 | 1 | 1 | 0 |
| | 0 | 1 | 1 | 1 | 1 |
| | 1 | 0 | 0 | 0 | 0 |
| | 1 | 0 | 0 | 0 | 1 |
| 5 | 1 | 0 | 0 | 1 | 0 ← |
| | 1 | 0 | 0 | 1 | 1 |
| | 1 | 0 | 1 | 0 | 0 |
| 6 | 1 | 0 | 1 | 0 | 1 ← |
| | 1 | 0 | 1 | 1 | 0 |
| | 1 | 0 | 1 | 1 | 1 |
| | 1 | 1 | 0 | 0 | 0 |
| 7 | 1 | 1 | 0 | 0 | 1 ← |
| | 1 | 1 | 0 | 1 | 0 |
| | 1 | 1 | 0 | 1 | 1 |
| 8 | 1 | 1 | 1 | 0 | 0 ← |
| | 1 | 1 | 1 | 0 | 1 |
| | 1 | 1 | 1 | 1 | 0 |
| | 1 | 1 | 1 | 1 | 1 |

ADDRESS/DATA BITS | CODE/CHECK BITS

SELF-CHECKING MEMORY CELL ARRAY APPARATUS

BACKGROUND OF THE INVENTION

The present invention relates generally to the field of memory cell arrays and apparatus for checking the integrity of data provided from and/or to such memory cell arrays.

Prior conventional memory cell arrays and their associated cell addressing apparatus typically did not provide any satisfactory way of insuring that the data stored and subsequently read out of such arrays was correct. FIGS. 1 and 2 of the present application indicate a prior memory cell apparatus and the structure of a conventional individual memory cell, respectively. With such previous memory cell array apparatus, the only way to check the integrity of the memory cell array was to essentially duplicate, in a redundant apparatus, all of the memory cell locations and all of the associated row and column decoder circuits, and then provide for reading data into both the primary and redundant array, reading data out of both of these arrays and comparing the output data to insure proper data correspondence. However, this did not detect any errors which might equally effect the data in both of the arrays, such as errors in the row or column address signals which are provided to both of the arrays. Also, such systems would be large and very costly in that they would essentially require the duplication of the memory cell array and its associated address decoder circuitry, as well as requiring additional circuitry to sequentially and/or simultaneously operate and compare both memory cell arrays. Unless a completely duplicate memory cell array and its associated row and column decoder circuitry was provided, prior systems could not detect any failure of a row or column decoder which would result in the addressing of the wrong memory cell and therefore the obtaining of the wrong data from an array.

SUMMARY OF THE INVENTION

An object of the present invention is to provide an improved memory cell array structure and an improved self-checking memory cell array apparatus which overcomes at least some of the deficiencies of the prior art noted above.

In one embodiment of the present invention, an improved memory cell array is provided. This memory cell array comprises: an array of individual memory cells arranged in a plurality of multiple cell rows and columns, each cell having two separate terminals at which a data bit and its complement are stored, respectively, and having two separate gates. One of the terminals in each cell is coupled through an associated one of the gates to an associated data line and another of the terminals is coupled through an associated another one of the gates to an associated data complement line, respectively. Each gate has a separate associated control terminal. The improvement in the array comprises separate row select connections a and b coupled to each cell in a predetermined row of the memory cell array. Each of the row select connections a is connected to the control terminal of one of the gates in each cell in the predetermined row, while each of the row select connections b is connected to the control terminal of the other of the gates in the cell in the predetermined row. The gates in each cell are separately actuatable in accordance with the signals on the row select connections a and b.

An embodiment of the present invention also provides a self-checking memory cell array apparatus comprising: an array of individual memory cells each cell having two separate terminals at which a data bit and its complement are stored, respectively, and having two separate gates. One of the terminals in each cell is coupled through an associated one of the gates to an associated data line and another of the terminals is coupled through an associated another one of the gates to an associated data complement line, respectively. Each gate has a separate associated control terminal. The improvement in the apparatus comprises separate row select connections a and b coupled to each cell in a predetermined row of the memory cell array; each of the row select connections a is connected to the control terminal of one of the gates in each cell in the predetermined row while each of the row select connections b is connected to the control terminal of the other gate in the cell in the predetermined row. The gates in each cell are separately actuatable in accordance with the signals on the row select connections a and b. At least one row address decoder is provided for receiving unidirectional error detecting code signals as input address signals and providing, in response thereto, simultaneous actuation of a pair of the row select connections a and b associated with one predetermined row of memory cells in the array.

Essentially, the present invention provides a new memory cell structure and then uses unidirectional error detecting code signals as row and column address input signals. These address signals are used to select data bits for a multiple bit data word wherein the bits of this data word are preferably stored in the memory cell array also in unidirectional error detecting code form. A first error detector circuit is preferably provided to produce an error indication if the data on any data bit read out of the memory cell array is identical to the data present on the data complement line associated with that data bit. In addition, a second error detector circuit is preferably provided to provide an indication of an error if the multiple bit data word out read of the memory cell array is not in unidirectional error detecting code form.

The providing of both the first and second error detectors, in combination with the new memory cell structure described herein, permits the preferred embodiment of the present invention to insure that data read out of the memory cell array will be identified as erroneous (1) if there was an error in either the row or column address signals received by the present memory apparatus, (2) if there was a failure by the row or column decoder circuits which resulted in the providing of erroneous data at the output of the memory cell array, or (3) if there was a unidirectional error corruption of data which had been stored in the memory cell array. This is accomplished without requiring the entire duplication of the memory cell array and all of the row and column decoder apparatus associated with the array. Preferably, unidirectional error detecting Berger codes are used as the format for the row and column address input signals provided to the row and column decoders, and the data stored in the memory cell array is also preferably coded in a Berger code format.

Additional features and advantages of the present invention are elaborated on in the subsequent more detailed description of the present invention.

BRIEF DESCRIPTION OF THE DRAWINGS

For a more complete understanding of the invention, reference should be made to the drawings, in which:

FIG. 3 is a combination block and schematic diagram of a memory cell array and apparatus constructed in accordance with the teachings of the present invention;

FIG. 7 is a schematic diagram illustrating a portion of a row decoder circuit used in the apparatus shown in FIG. 3;

FIG. 9 is a schematic diagram of one of the column interface circuits shown in FIG. 8.

DESCRIPTION OF THE PREFERRED EMBODIMENTS

Figure 1:
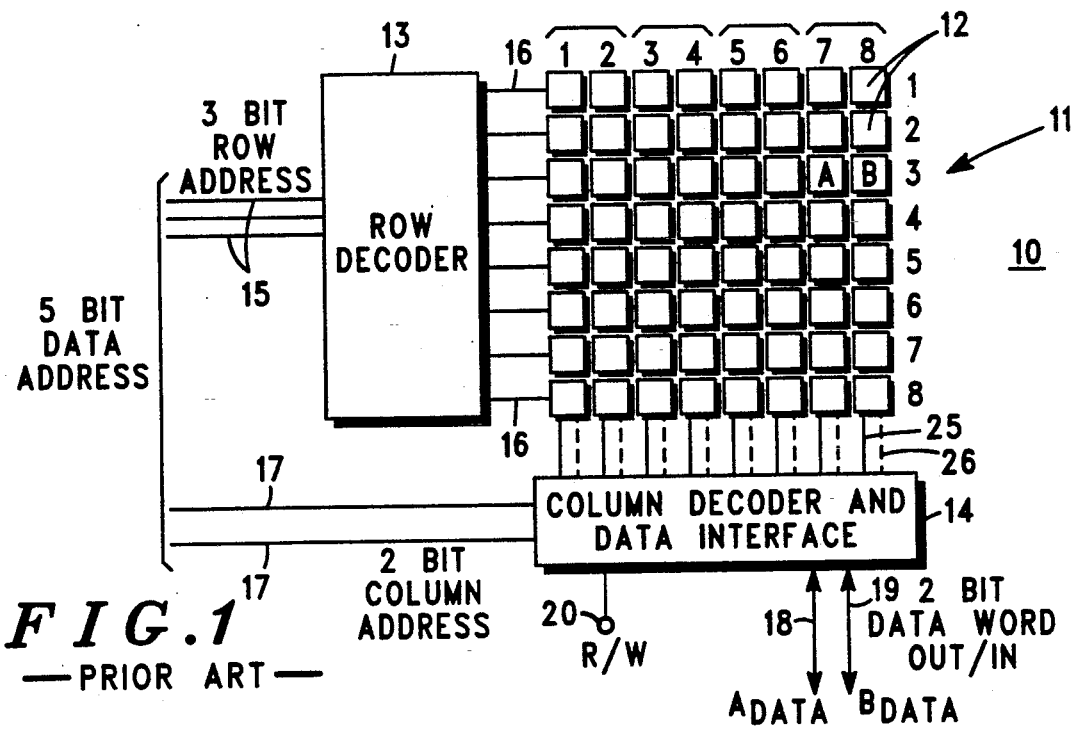
FIG. 1 is a block diagram of a prior memory cell array and apparatus.

Referring to FIG. 1, a prior art electronic memory cell array apparatus 10 is illustrated which includes an 8 row by 8 column array 11 of individual memory cells 12, each cell capable of storing a 0 or 1 digital logic bit. To selectively address the individual memory cells 12, a row decoder 13 is provided along with a column decoder and data interface circuit 14. The row decoder 13 receives a 3 bit row address, via three signal bit row address lines 15, and, in response thereto, actuates any one of 8 row select lines 16 so as to select any one of the 8 rows of the array 11. Similarly, the column decoder and data interface circuit 14 receives a two bit column address signal, via two single bit column address lines 17, and, in response thereto, the column decoder and data interface circuit 14 effectively selects pairs of columns (1-2, 3-4, 5-6 or 7-8) and effectively connects these columns to separate $A_{DATA}$ and $B_{DATA}$ output lines 18 and 19. In addition, the column decoder and data interface circuit 14 also receives a read/write (R/W) signal at an input terminal 20.

Figure 2:
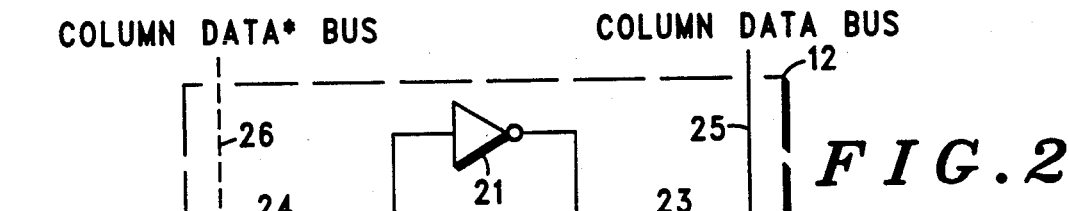
FIG. 2 is a schematic diagram of the structure of one memory cell in the prior memory cell array shown in FIG. 1.

Referring to FIG. 2, the structure of one of the prior art memory cells 12 is illustrated. The memory cell 12 comprises a pair of cross coupled inverter circuits 21 and 22 each having a separate associated output terminal, $21_A$ and $22_A$, coupled through separate associated gate circuits 23 and 24 to separate associated column data and column data complement (*) lines 25 and 26, respectively. Control terminals $23_A$ and $24_A$ of the gates 23 and 24 are each connected to a same one of the row select lines 16. The column data lines 25 and 26 essentially comprise column data bus lines for the data stored in each column of the memory cells 12 in the array 11.

Essentially, the prior memory cell array apparatus 10 receives a 5 bit data address which comprises a 3 bit row address on lines 15 and a 2 bit column address on the lines 17. The 3 bit row address selects, via decoder 13, one of the 8 rows of the memory cell array 11. The 2 bit column address, via circuit 14, selects a pair of columns of the memory array 11 so as to provide a 2 bit data word output formed by the single bit output lines 18 and 19 or so as to permit data on the lines 18 and 19 to be read into selected memory cells 12 in the array 11. In FIG. 1, the data from each memory cell 12 in a particular column is coupled to the column decoder and data interface circuit 14 via the associated column data bus and column data complement (*) buses 25 and 26 wherein these buses correspond to the data and data complement lines 25 and 26 shown in FIG. 2.

The memory cell array apparatus shown in FIGS. 1 and 2 essentially comprises a prior art system in which pairs of memory cells are selected via addressing the rows and columns that these memory cells appear in. The contents of these memory cells are then selectively either read out via the data lines 18 and 19, or data on these lines is read into the selected memory cells. In FIG. 1, for example, a pair of selected memory cells A and B are illustrated indicative of the selection of the third row of the array 11 and the selection of the 7th and 8th columns of the array. As is conventional in the prior art, not just the data stored in each memory cell 12 is addressed, but also the complement of this data is addressed. This data complement information is conventionally used by the column decoder and data interface circuit 14 to assist in the proper reading of data into the array 11. This is because it is conventional to read in data so as to force either the data or data complement line to 0 depending upon whether a 1 or 0 is to be stored as data in one of the memory cells 12. This operation is conventional and the internal structure for the row decoder 13 and the column decoder and data interface circuit 14 is also conventional.

In prior memory cell systems, such as the apparatus 10, it is possible that many different types of faults may occur. One such fault could be the generation of an incorrect row or column address on lines 15 or 17 resulting in selecting the wrong memory cells and therefore providing erroneous data on the output lines 18 and 19. In addition, there can be a malfunction of either the row decoder 13 or the column decoder and data interface circuit 14 also resulting in selecting the wrong cells and providing erroneous data on the output lines 18 and 19. Also, after data has been stored in the memory cell array 11, this data may be corrupted by external transient signals such that when the data is correctly selected and subsequently read out, erroneous data may be provided on the output lines 18 and 19. Prior memory cell array systems have not adequately indicated when erroneous data is provided on the output lines 18 and 19 due to an occurrence of any one of the above noted faults. Without such an indication, the memory cell array 11 can unknowingly provide erroneous data as an output. In applications such as the use of a memory cell array to store critical data related to the control of an automotive braking system, for example, the use of such erroneous data can lead to catastrophic results.

The present invention utilizes an improved memory cell structure and improved row decoder and column decoder and data interface circuits so as to indicate when erroneous data may be provided at the output lines due to the occurrence of a unidirectional error. A unidirectional error, as is known in the art, consists of the corruption of one or more data bits of a digital signal in an identical polarity manner. Thus all incorrect data bits of a word are either all 1's or all 0's, but each incorrect word will not have some incorrect 1 bits and some incorrect 0 bits. Such data corruption as a result of unidirectional errors is by far the most common type of data corruption which is likely to exist. The present invention provides a memory cell array apparatus which indicates when unidirectional errors corrupt the output signals. This is accomplished without duplicating all of the memory cells and row decoder and column decoder and data interface circuits shown in the prior FIG. 1 system. Such duplication of the prior system would merely provide a redundant second system which hopefully would not suffer from the same unidirectional error data corruption as the first such system. Such a system would clearly not be cost effective and would not protect against both the first and second systems suffering from the same type of unidirectional error such as having both systems receive incorrect row or column address input signals.

Referring to FIG. 3, an improved memory cell array apparatus 30 is illustrated comprising an 8 row and 16 column array 31 of individual memory cells 32. A row decoder 33 is provided which receives a 5 bit coded row address via row address lines 34, designated in FIG. 3 as lines $r_4$ through $r_0$. A column decoder and data interface circuit 35 is provided which receives a 4 bit coded column address signal via column address lines 36, designated in FIG. 3 as lines $c_3$ through $c_0$. At a read/write terminal 37, a read or write input signal is provided to the column decoder and data circuit 35, and the interface circuit 35 provides 2 single bit data output-/input lines 38 and 39 and 2 single bit output/input data check bit lines 40 and 41. In addition, the column decoder and data interface circuit 35 provides a pair of error output lines 42 and 43 which are coupled as inputs to an error detector 1 also designated by the reference numeral 44. Any of the 8 rows of the array 31 is effectively selected by the row decoder 33 providing high (logic 1) signals on a pair of separate row select lines 45 and $45_a$ associated with each of the rows. Specific row select lines are designated by the row number followed by A and B subscript notation. The row select lines for any row are separate and potentially independent of one another. Column data and column data complement busses associated with each column in the array 31 are coupled to the column decoder and data interface circuit 35 via associated column data and column data complement lines 46 and 46*. The data lines 46 are shown solid in FIG. 3 and the data complement lines 46* are shown dashed.

The 4 data output/input signals for the column decoder and data interface circuit 35 are designated in FIG. 3 as comprising bits A, B, $C_1$ and $C_2$ corresponding to the lines 38 through 41 which are connected as inputs to an error detector 2 shown dashed in FIG. 3 and designated by the reference numeral 47. The structure of the error detector 2 is illustrated in FIG. 3 as comprising as an array of logic gates which receives the signals A, B, $C_1$ and $C_2$ and provides, at an output terminal 48, a signal indicative of whether proper data is being read out of the memory cell array 31. Similarly, the error detector 1 (circuit 44) has an output terminal 49 at which an error indication signal is provided. In both cases, the presence of a high (logic 1) signal at either of the terminals 48 or 49 is indicative of erroneous data being provided on the data lines 38 through 41 due to the occurrence of some unidirectional error affecting either the input addresses on lines 34 or 36, the row or column decoding operations, or some unidirectional corruption of data stored in any of the memory cells 32 being address by the apparatus 30. This enables subsequent mechanisms or circuits which utilize the output data A, B, $C_1$, and $C_2$ from the apparatus 30 to ignore this data since it is known that this data is incorrect. This therefore can prevent results which may be catastrophic due to the use of incorrect data.

Figure 4:
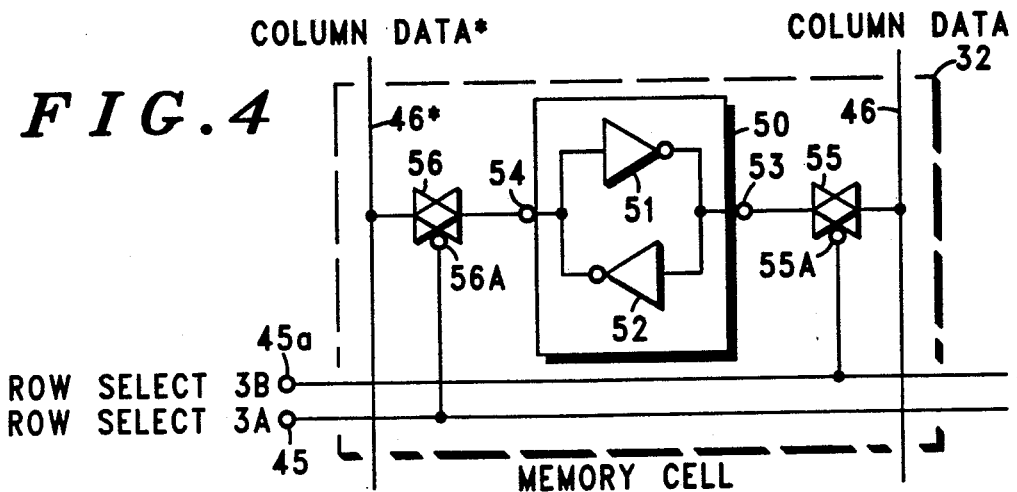
FIG. 4 is a schematic diagram of one memory cell in the memory cell array shown in FIG. 3.

A key feature which enables the present invention to produce its desirable result is the utilization of a new structure for each of the memory cells 32. This new structure is illustrated in FIG. 4. The memory cells 32, as was the case with the memory cells 12, each store a predetermined desired data bit and its complement. In FIG. 4, each memory cell 32 is indicated as comprising a memory cell core 50 which preferably comprises 2 cross coupled inverter stages 51 and 52 each having an associated output terminal 53 and 54, respectively. While cross coupled inverters comprise the memory cell 50 illustrated in FIG. 4, other types of memory cell cores could comprise the cell 50 as long as they could store data and its complement.

The terminal 53, designated as a data terminal, is selectively coupled through a gate 55, having a control terminal 55A, to the column data line 46 used for the column of memory cells in which the cell 32, shown in FIG. 4, is located. Similarly, the terminal 54, designated as a data complement terminal, is selectively coupled through a gate 56, having a control terminal 56A, to the column data* line 46*. The gates 55 and 56 selectively provide effective short and open circuits between data stored at the terminals 53 and 54 and the data and data* lines 46 and 46* in accordance with the signals at terminals 55A and 56A, respectively. In FIG. 4, the row select lines 45 and 45a for the hypothetical selection of row 3 are illustrated with a row select line $3_A$ directly coupled to the terminal 56A and a separate and independent row select line 3B directly coupled to the control terminal 55A. This structure distinguishes the memory cell 32 from the memory cell 12 in which the control terminals of both of the corresponding gates 23 and 24 were each coupled together and to a single row select line. In the present case, separate row select lines are utilized so as to separately control each of the gates 55 and 56. This enables the improved memory cell apparatus 30 shown in FIG. 3 to achieve its desired end results.

The apparatus 30 shown in FIG. 3 will produce a 2 bit data word as bits A and B as an output/input for its associated memory cell array. However, the apparatus 30 will utilize unidirectional error detecting codes for the row and column address signals received on the address line 34 and 36. In response to a properly coded row and column address, the apparatus 30 will select four individual memory cells, preferably in the same row, with 2 of these cells comprising data bits A and B and 2 of the cells comprising check bits C1 and C2. The data and check bit data stored in these memory cells is also stored in a unidirectional error detecting code format.

Basically, the error detector 47 shown in FIG. 3 determines when the data and check bits read out of the array 31 actually comprise a unidirectional error detecting code. If so, 0 is provided at the terminal 48 indicating a correct readout of data. If the read out data and check bits do not correspond to a unidirectional error detecting code, a logic 1 is provided at the terminal 48 indicating erroneous data is being read out. The error detector 44 is utilized to indicate when the column data bus and column data* bus associated with any selected column of array 32 have identical logic states. This is an obvious indication of the misreading of data since for each addressed memory cell its associated column data and data* lines must have opposite logic states. Thus, in general, the error detectors 44 and 47 of the apparatus 30 enable the present system to provide error indications in case of either an input row address error, an input column address error, the failure of either the row decoder or the column decoder and data interface circuits to provide proper row and column select signals to the array 31 or the unidirectional error corruption of the data bits stored in the memory cells 32 due to some condition. The bottom line is that for any of such faults, either the data being read out by the column decoder and data interface circuit 35 will no longer correspond to a unidirectional error detecting code and thus the error detector 47 will provide an error indication, or the selected data and data complement bus lines for a selected column of memory cells will be equal to each other and error detector 44 will provide an indication. The manner in which these desirable results are achieved will now be elaborated on in connection with the specific structure of the row decoder 33 and the column decoder and data interface circuit 35 and their use of unidirectional error detecting code signals as row and address input signals.

Figures 5, 6, 10:
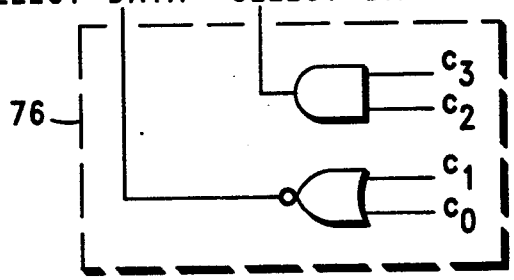
FIG. 5 is a table illustrating a 2 data bit, 4 bit unidirectional error detecting code used with the apparatus shown in FIG. 3.
FIG. 6 is a table illustrating a 3 data bit, 5 bit unidirectional error detecting code used with the apparatus shown in FIG. 3.
FIG. 10 is a schematic diagram of a portion of one of the column decoder circuits shown in FIG. 8.

Referring to FIG. 5, a table is provided which illustrates the use of a 4 bit unidirectional error detecting code to encode 2 data bits which form a data word. Unidirectional error detecting codes are codes which, as is known, utilize an additional one or more code or check bits to provide protection against the corruption of the data bits by unidirectional errors wherein a unidirectional error consists of incorrect data bits of a data word all being changed in the same polarity direction. In FIG. 5, the 4 bit unidirectional error detecting code shown is that of a Berger code which is known to be a unidirectional error detecting code. However, other unidirectional error detecting codes such as a 2 rail code or an m out of n unidirectional error detecting code could be utilized.

Essentially, table 5 illustrates that for any combination of logic states for the 2 address/data bits, only a single one of four possible combinations of 2 code/check bits will exist so as to verify the correctness of the address/data bits. This single correct combination of code/check bits is indicated by an arrow in FIG. 5. Thus, for a 01 address bit data word to be identified as being proper, the associated code/check bits with this word must also be 01. Any other combination of code/check bits will be indicative of the occurrence of a unidirectional error in either the address/data bits or the code/check bits. The table in FIG. 5 corresponds to the 4 bit coded column address signals provided on the lines 36 corresponding to the address lines $c_3$ through $c_0$ in FIG. 3. The 4 data bit unidirectional code shown in FIG. 5 also corresponds to the data output/input lines A, B, $C_1$ and $C_2$, comprising the output lines 38 through 41 shown in FIG. 3. The above notations are superimposed on the table in FIG. 5 to assist in better understanding the use of the unidirectional codes by the apparatus 30.

FIG. 6 illustrates a Berger code unidirectional error detecting code for a 3 data bit word wherein the resultant unidirectional error detecting code has a total 5 data bits. Again, the only correct identification of the 3 address/data bits by a pair of corresponding code/check bits is indicated by an arrow shown in FIG. 6. The 5 bit unidirectional error detecting code shown in FIG. 6 corresponds to the signals provided as coded row address input signals on the row address lines 34 comprising the lines $r_4$ through $r_0$ in FIG. 3. While the existence of unidirectional error detecting codes was previously known, prior systems did not employ them as the present apparatus 30 to provide error detection signals indicative of not only input address signal failures, but also row decoder and column decoder failures as well as any corruption of multiple bit word data stored in memory cells.

Essentially, the present apparatus 30 utilizes unidirectional error detecting code signals as coded row address signals for the row decoder 33. In addition, unidirectional error detecting code signals are also utilized for the column address signals provided to the column decoder and interface circuit 35. Also, the multiple bit data words stored in the memory array 31 are coded as a unidirectional error detecting code. In addition, the improved memory cell structure shown in FIG. 4 is utilized for each of the memory cells 32. This results in the present apparatus 30 providing error detection signals for unidirectional errors which may occur.

The row decoder 33 essentially responds to the signals provided on the address lines 34 by selecting a pair of row select lines 45 and 45a associated with one row to be selected if a proper unidirectional error detecting code is received on the lines 34. FIG. 7 illustrates a portion 60 of the circuitry within the row decoder 33 that responds to proper row address signals on lines 34 so as to select the row select lines $3_A$ and $3_B$ to therefore select the third row of the array 31. The portion 60 obviously comprises just a simple logic circuit. What is significant is that only the proper unidirectional error detecting code provided on the row address lines 34 (wherein this code has data corresponding to the correct unidirectional error detecting code associated with the third set of data in the table in FIG. 6), will result in the selection of the row select lines 3A and 3B. Any other received unidirectional error detecting code as a row input address, or any unidirectional error corruption of any of the signals indicated in FIG. 6 as possible 5 bit address signals will not result in the selection of the row select lines $3_A$ and $3_B$. While the portion 60 shows the circuitry associated with selecting the third row of the array 31, similar circuitry exists for selecting any of the other 8 rows.

Figure 8:
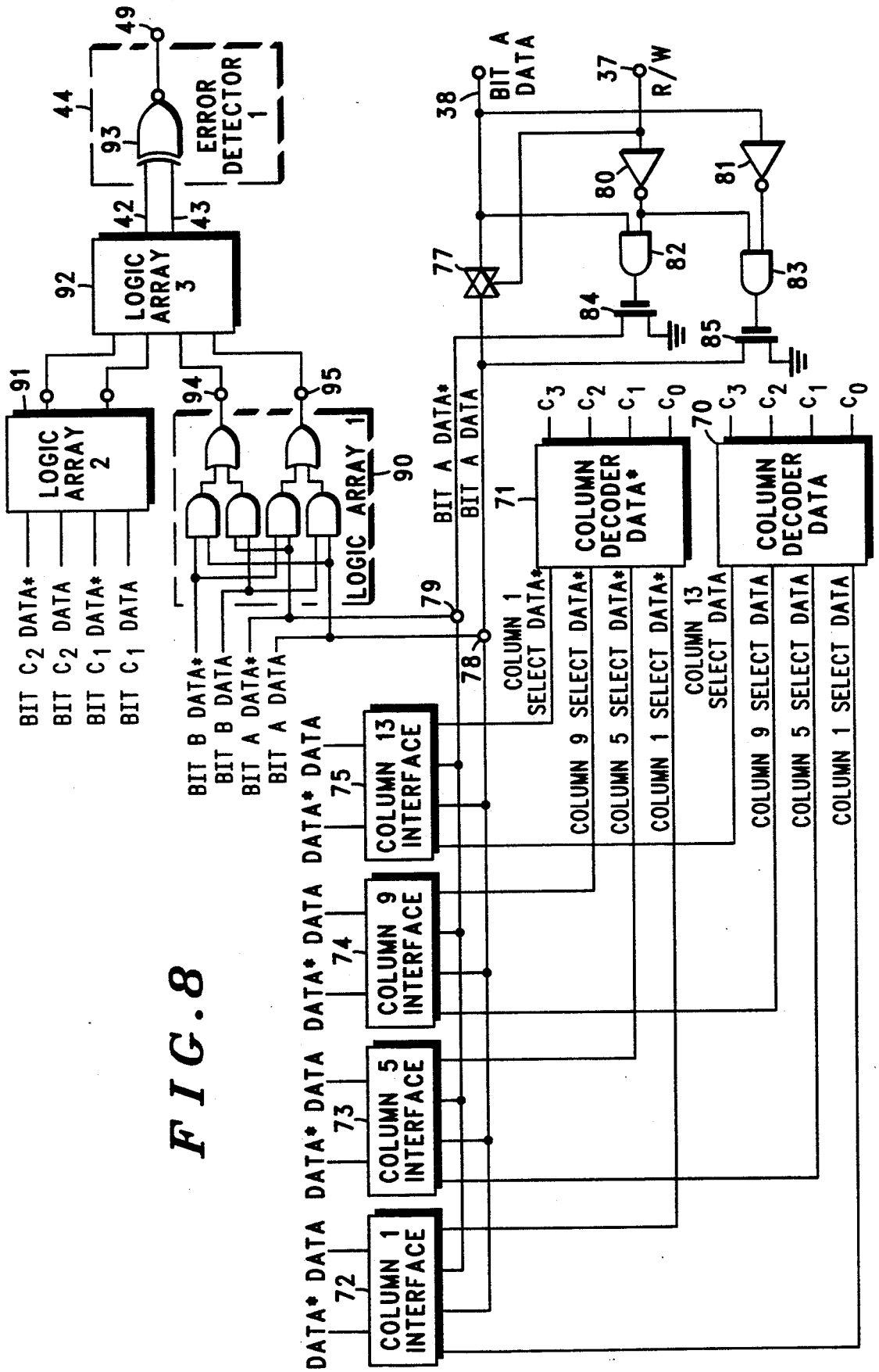
FIG. 8 is a schematic diagram of a portion of a column decoder and data interface circuit used in the apparatus shown in FIG. 3.

Referring to FIG. 8, a portion of the circuitry within the column decoder and data interface circuit 35 is illustrated which results in the selection of any one of the columns 1, 5, 9 or 13. Similar structure exists for the selection of the other columns. It should be noted that for any proper address signal on the lines 36, in FIG. 3, four columns of memory cells are selected, with separate data buses for the selected columns being separately coupled to the line 38-41. In FIG. 8, the column address lines 36, designated as $c_3$ through $c_0$, are received by column decoder data and column decoder data* circuits 70 and 71. The column decoder data circuit 70 provides 4 separate column select lines each coupled to a separate column interface circuit 72 through 75 associated with the selection of the columns 1, 5, 9 and 13. Similarly, the column decoder data * circuit 71 provides 40 separate column select lines coupled to these same column interface circuits. Each of the column interface circuits 72 through 75 provides a pair of data and data complements lines (DATA, DATA*) corresponding to the column data lines 46 and 46* shown in FIGS. 3 and 4. The data lines 46 and 46* comprise data and data complement buses for each column. FIG. 9 illustrates the typical contents of any one of the interface circuits 72 through 75, while FIG. 10 illustrates a portion 76 of the circuitry within each of the column decoder data and column decoder data* circuits 70 and 71 which is utilized to respond to the address signals $c_3$ through $c_0$ so as to select column 13, for example.

The circuitry in FIG. 8 essentially represents the data input/output structure utilized to select any one of the columns 1, 5, 9 or 13 so as to provide the proper connection of the column data and the column data * data buses for those columns to the data output bit A corresponding to the output line 38 shown in FIG. 3. The data bit A output line 38 is shown in FIG. 8 as being coupled through a gate 77 to a terminal 78. This terminal 78, corresponding to the data A bit, is connected to each of the column interface circuits 72 through 75. When a proper 4 bit unidirectional error detecting code address is received on the lines 36, the data bus line 46 of one of the columns 1, 5, 9, or 13 will be connected to the terminal 78. The column interface circuits 72, 73, 74 and 75 connect the proper selected data column bus 46 to the terminal 78. In a similar manner, a terminal 79, at which the output bit A data complement signal is provided, is connected to each of the column interface circuits 72 through 75. For the receipt of a proper unidirectional error detecting code as a column address on lines 36, the data complement line bus 46* for the selected column will be provided at the terminal 79 by the interface circuits 72–75.

The circuitry described above in connection with the column decoder and data interface circuit 35 merely represents how this circuit responds to unidirectional error coded address signals on the lines 36 to select the appropriate one of four columns in the array 31 to be connected to the terminals 78 and 79 so as to provide a proper connection to the output/input data bit A line 38. When data is read out of the memory cell array 31, a high or 1 logic state is provided at the read/write terminal 37 shown in FIG. 8. This results in the gate 77 providing a direct short circuit connection between the terminal 78 and the data bit A line 38. If it is desired to read data into the memory array 31, some additional circuitry is required because it is desirable to always write data into one of the memory cells 32 as a 0 (ground potential) rather than as a logic 1. Thus there has to be some selection of whether such 0 data will be written on the data or the data complement line associated with the selected memory cell. This operation is conventional and is achieved in the present apparatus by inverters 80 and 81, AND gates 82 and 83 and FETs 84 and 85 connected as shown in FIG. 8.

The function of the components 80 through 85 is just to select whether, during a write cycle, a 0 (ground) will be written onto the data or data complement line associated with the selected memory cell where the data is to be stored. In order to make this determination it is necessary to determine whether a 0 or 1 bit of data is to be stored, as well as determining if the state of the read/write signal at the terminal 37 indicates that data is to be written into the array 31. The components 80–85 accomplish this. Such operation is conventional and also took place with regard to the prior apparatus 10 shown in FIG. 1. The reason why it is desired to write a 0 on the data or data complement line of a memory cell is that this provides a more reliable entering of data into the memory cell. Also, it should be understood that the normal state of any of the data and data complement bus lines 46 or 46* is high unless these lines are otherwise driven low by the FET driver devices 84 or 85 or by a 0 bit data stored in one of the memory cells driving these lines low when that memory cell is addressed in a read cycle.

As noted previously, a feature of the present embodiment is that an error detection is provided if any pair of the data and data complement lines 46 and 46* of an addressed column are equal to each other in logic state. Obviously, for any one addressed memory cell, the associated data and data complement lines are complements of each other. Thus equality of the data and data complement buses for that cell would indicate a fault. Detecting such faults is achieved in the apparatus 30 by 3 logic array circuits 90, 91 and 92 shown in FIG. 8 which together develop the signals on the error output lines 42 and 43 that are provided to the error detector 44. In FIG. 8, the error detector 44 is indicated as comprising merely an exclusive NOR gate 93 which will produce an error indication(a high logic state) at the terminal 49 for identical high or low logic signals being present on both of the lines 42 and 43.

Suitable logic circuitry for logic array 90 is shown in FIG. 8 and arrays 91 and 92 are constructed and function similarly. The logic array 90 receives inputs from the bit A data and bit A data* terminals 78 and 79. In addition, the logic array 90 also receives similar inputs from terminals associated with the bit B data and bit B* lines. The logic circuitry of array 90 produces a pair of outputs at terminals 94 and 95 wherein equality of the signals at these terminals (both signals having the same logic state) indicates that the data and data* lines for any of either of the A or the B data bits provided on lines 38 and 39, respectively, are equal to each other. Logic array 91 accomplishes the same function for the data and data* connections associated with the check bits $C_1$ and $C_2$ provided on lines 40 and 41. Logic array circuit 92 combines the outputs of the logic arrays 90 and 91 to provide a composite pair of output signals on the error output lines 42 and 43. In essence, the logic arrays 90 through 92 perform the function of monitoring the data and the data complement bus lines provided from each column selected to be used to determine the signals on the output/input lines 38 through 41. Whenever an output data bit is read out of the array 31 on one of the lines 38–41, but its complementary data bit which is read out is identical, an error indication will be provided by a logic one state at the terminal 49.

While the apparatus 30 has been described in accordance with providing a 2 bit data word while utilizing 2 check bits so as to provide the output/input lines 38 through 41, obviously the apparatus 30 can be expanded to provide a more than 2 bit data word. It should be noted that if a 3 bit data word were desired for the apparatus 30, still only 2 check bits would be necessary. For providing a 4 to 7 data bit output word, 3 check bits would be necessary, whereas providing an 8 through 15 data bit output word would utilize 4 check bits and a 16 through 31 data bit word would utilize 5 check bits. This all assumes utilization of a Berger unidirectional error detecting code for the output/input word. The significance of this is that providing for detecting faults in the memory system as contemplated by the present invention does not mean that the number of required memory cells would correspond to twice the number of memory cells in a single array as per the prior art redundant system discussed above. For example, the present apparatus 30 utilizes Berger codes for providing an improved memory system for a 2 bit output data word, and this is accomplished by the use of a 8 by 16 memory array having 128 memory cells. A prior redundant system, which would duplicate the system 10 shown in FIG. 1, would also utilize 128 cells, but would not be able to detect some of the errors which are efficiently detected by the present invention. However, when a 3 bit data word is contemplated as the output of a memory system, the present invention, by expanding the apparatus shown in FIG. 3, would utilize an 8 by 20 array of 160 cells as opposed to 2 prior 8 by 12 arrays comprising of 192 cells. The savings in memory space is even more pronounced for 4 and 5 bit data output words in which the memory cells utilized by an embodiment in accordance with the present invention would comprise 224 and 256 cells as compared to a prior redundant system's utilization of 256 and 320 cells, respectively.

While I have shown and described specific embodiments of the present invention, further modifications and improvements will occur to those skilled in the art. Such modifications could comprise utilization of unidirectional error detection codes other than Berger codes for the coded row address signals and the coded column address signals provided on the lines 34 and 36, as well as for the coding of the data to be stored in the memory cells 32. Also, memory cell cores comprising other than cross coupled inverters could be utilized as long as the memory cell core was able to effectively store data and data complement information. All such modifications and improvements which retain the basic underlying principles disclosed and claimed herein are within the scope of this invention.

I claim:

1. An improved memory cell array comprising:
   an array of individual memory cells arranged in a plurality of multiple cell rows and columns,
   each of said memory cells having two separate terminals at which a data bit and a complement of said data bit are stored, respectively, and having two separate gates, one of said terminals at which said data bit is stored is coupled through an associated one of said gates to an associated data line and another of said terminals at which said data complement is stored is coupled through a different associated one of said gates to an associated data complement line, each gate having a separate associated control terminal;
   wherein the improvement comprises separate row select connections a and b coupled to each of said memory cells in a predetermined row of the memory cell array, each of said row select connections a connected to the control terminal of said one of said gates in each cell in said predetermined row while each of said row select connections b connected to the control terminal of said different one of said gates in said cell in said predetermined row, said gates being separately actuatable in accordance with the signals on said row select connections a and b.

2. An improved memory cell array according to claim 1 wherein each cell includes a pair of cross coupled inverters connected between said terminals of said cell.

3. An improved memory cell array according to claim 1 wherein each of said gates in each of said cells selectively provides effective short and open circuits between data stored in said memory cells and an associated one of said data and data complement lines in accordance with the signal provided at the gate's control terminal.

4. An improved memory cell array according to claim 3 wherein each of said memory cells in each column in said memory cell array has the data line of said memory cell connected to a common column data line associated with the column in which said memory cell is located and said data complement line of said memory cell connected to a common column data complement line associated with the column in which said memory cell is located.

5. A self-checking memory cell array apparatus comprising:
   an array of individual memory cells arranged in a plurality of multiple cell rows and columns,
   each of said memory cells having two separate terminals at which a data bit and a complement of said data bit are stored, respectively, and having two separate gates, one of said terminals at which said data bit is stored is coupled through an associated one of said gates to an associated data line and another of said terminals at which said data complement is stored is coupled through a different associated one of said gates to an associated data complement line, respectively, each gate having a separate associated control terminal,
   wherein the improvement comprises separate row select connections a and b coupled to each of said memory cells in a predetermined row of the memory cell array, each of said row select connections a connected to the control terminal of said one of said gates in each cell in said predetermined row while each of said row select connections b connected to the control terminal of said different one of said gates in said cell, said gates being separately actuatable in accordance with the signals on said row select connections a and b; and
   at least one row address decoder for receiving unidirectional error detecting code signals as input address signals and providing in response thereto, simultaneous actuation of a pair of said row select connections a and b associated with one predetermined row of memory cells in said memory cell array.

6. A self-checking memory cell array apparatus according to claim 5 wherein each one of said memory cells in each column in said memory cell array has the data line of said memory cell connected to a common column data line associated with the column in which said memory cell is located and said data complement line of said memory cell connected to a common column data complement line associated with the column in which said memory cell is located.

7. A self-checking memory cell array apparatus according to claim 6 which includes error detection apparatus for detecting errors by comparing data on the column data and column data complement lines and indicating an error if said data is identical.

8. A self-checking memory cell array apparatus according to claim 7 which includes error detection apparatus for detecting errors in data stored in said memory cell array by detecting when said data read out of said memory cell array is in a non unidirectional error detecting code format.

9. A self-checking memory cell array apparatus according to claim 8 which includes at least one column address decoder for receiving column address input signals and, in response thereto, selecting at least one column of said memory cells in said memory cell array, and which includes means for providing unidirectional error detecting code signals as both row and column address input signals to said row and column address decoders, respectively, for said memory cell array.

10. A self-checking memory cell array apparatus according to claim 7 which includes at least one column address decoder for receiving column address input signals and, in response thereto, selecting at least one column of said memory cells in said memory cell array, and which includes means for providing unidirectional error detecting code signals as both row and column address input signals to said row and column address decoders, respectively, for said memory cell array.

11. A self-checking memory cell array apparatus according to claim 5 which includes error detection apparatus for detecting errors in data stored in said array by detecting when said data read out of said memory array is in a non unidirectional error detecting code format.

12. A self-checking memory cell array apparatus according to claim 5 which includes at least one column address decoder for receiving unidirectional error detecting code signals as column address input signals and, in response thereto, selecting at least one column of said memory cells in said memory cell array.

13. A self-checking memory cell array apparatus according to claim 12 wherein said unidirectional error detecting code signals comprise signals coded in accordance with one of the following groups of unidirectional error detecting codes consisting of Berger codes, m-out of-n codes and 2-rail codes.

14. A self-checking memory cell array apparatus according to claim 12 wherein said unidirectional error detecting code signals comprise signals coded as Berger code signals.

15. A self-checking memory cell array apparatus according to claim 5 which includes at least one column address decoder for receiving column address input signals and, in response thereto, selecting at least one column of said memory cells in said memory cell array, and which includes means for providing unidirectional error detecting code signals as both row and column address input signals to said row and column address decoders, respectively, for said memory cell array.

* * * * *